United States Patent [19]

Grellmann et al.

[11] Patent Number: 4,657,322
[45] Date of Patent: Apr. 14, 1987

[54] MICROWAVE INTERCONNECT

[75] Inventors: H. Erwin Grellmann, Beaverton; Keith E. Jones, Aloha; Carl W. Laakso; John A. Wright, both of Portland, all of Oreg.

[73] Assignee: Tektronix, Inc., Beaverton, Oreg.

[21] Appl. No.: 782,244

[22] Filed: Oct. 1, 1985

[51] Int. Cl.$^4$ .............................................. H01R 9/09
[52] U.S. Cl. .............................. 339/17 M; 339/61 M
[58] Field of Search ............ 339/17 F, 17 LM, 17 M, 339/17 CF, 61 M, 59 M, DIG. 3

[56] References Cited

U.S. PATENT DOCUMENTS 4,057,311 11/1977 Evans ................................. 339/61 M
4,255,003 3/1981 Berg ................................. 339/17 CF
4,575,166 3/1986 Kasdagly et al. ................. 339/61 M Primary Examiner—Neil Abrams
Attorney, Agent, or Firm—John P. Dellett; Francis I. Gray

[57] ABSTRACT

A microwave interconnect for integrated or hybrid circuits includes a flexible sheet bearing a flexible conductor which is divided into a plurality of insulated conductive lines, at least some of which make contact with the integrated or hybrid circuit, as well as with a second circuit to which the first is thereby connected. The flexible sheet is backed by a body of elastomeric material and a compression bar which assures good electrical contact of the flexible conductor with the circuits when the compression bar is tightened down on the circuits. The construction allows some degree of misregistration of parts while providing circuit coupling operative at high frequencies.

9 Claims, 9 Drawing Figures

MICROWAVE INTERCONNECT

BACKGROUND OF THE INVENTION

The present invention relates to a microwave interconnect device, and particularly to such a device for making good connection with integrated or hybrid circuits at high operating frequencies.

Making connection to integrated or hybrid circuit devices operating at relatively high radio frequencies can be difficult because the integrated or hybrid circuit devices frequently have conductors and terminals with transmission line characteristics which must be properly matched to avoid faulty operation. Heretofore, these circuit devices have been wired in place with bonded connections inside an RF housing unit, making them difficult to replace or service. Not only would it be of advantage to provide removable connections to these devices, but it would also be of advantage to position the devices at locations which are relatively inaccessible to conventional bonding ma- chines.

One suitable electrical connector for removably connecting integrated and hybrid circuit devices within an RF housing is disclosed and claimed in U.S. Pat. Nos. 4,150,420 and 4,255,003 to Berg. In this connector, electrical contacts for a microcircuit are formed and elastomeric material is injected therearound. The contacts and elastomeric material are ridge shaped to procure a contact wiping action during connection. While the patented device is quite advantageous for many applications, yet problems can develop at the higher frequencies, e.g., above two gigahertz, especially when the prior connector and the microcircuit, as well as the board or other means to which the microcircuit is connected, are not completely aligned. The elastomer-supported conductor in the patented device is relatively solid and is dependent in operation upon good registration of the parts to avoid RF discontinuities. Moreover, the prior device is expensive to manufacture and somewhat limited in application to making connection with a circuit board having a predetermined geometrical configura- tion.

SUMMARY OF THE INVENTION

In accordance with the present invention, an interconnect, adapted to provide electrical connection with an integrated or hybrid circuit device, includes a flexible insulating medium provided with a conductive layer adapted to make connection to the aforesaid circuit device and a second device which may also comprise an integrated or hybrid circuit, or which may comprise an electrical connector or other conducting means. A body of elastomeric material is constrained in compressive relationship against the flexible medium for urging the conductive layer against the aforementioned circuit device and second device, making connection with conductive surfaces thereof. The conductive layer is thin and flexible and conforms to the conductive surfaces even though there may be some physical misalignment or misregistration of the parts.

Moreover, in accordance with one embodiment, the conductive layer on the flexible medium is separated into a plurality of spaced or parallel conductors, wherein the overall width of the conductive layer is wider than the terminal portions on the circuit device and the second device, providing an actual conductive width which is adaptive to nearly any degree of registration. Discontinuity is avoided as might be occasioned if the aforementioned conductive layer were merely wider than the terminal portions on said circuit device and second device.

Thus, not only is physical misalignment in a direction perpendicular to the interface between the various conductors compensated for, but also lateral misalignment or misregistration of the connected parts is compensated for without producing unacceptable RF discontinuity effects at high frequencies.

It is accordingly an object of the present invention to provide an improved microwave interconnect device which is substantially self-aligning.

It is another object of the present invention to provide an improved microwave interconnect device having a conductive interconnection which conforms to the terminal portions of a microcircuit and another microcircuit or other device.

It is another object of the present invention to provide an improved microwave interconnect devices which avoids RF discontinuities as might otherwise be occasioned by physical misalignment or misorientation of parts.

It is a further object of the present invention to provide an improved microwave interconnect device which is less expensive to produce than prior microwave interconnect devices.

The subject matter of the present invention is particularly pointed out and distinctly claimed in the concluding portion of this specification. However, both the organization and method of operation of the invention, together with further advantages and objects thereof, may best be understood by reference to the following description taken in connection with the accompanying drawings wherein like reference characters refer to like elements.

DETAILED DESCRIPTION

Figure 1:
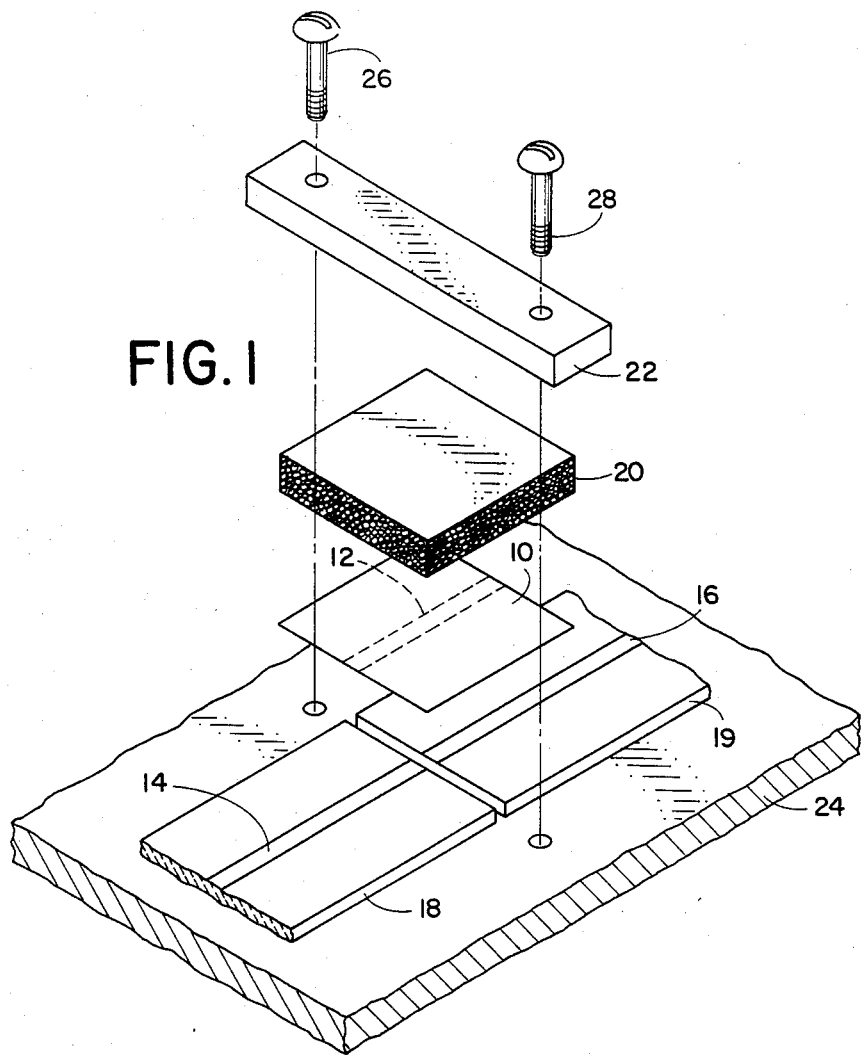
FIG. 1 is a perspective, exploded view, partially broken away, of a microwave interconnect device according to the present invention.
Figure 2:
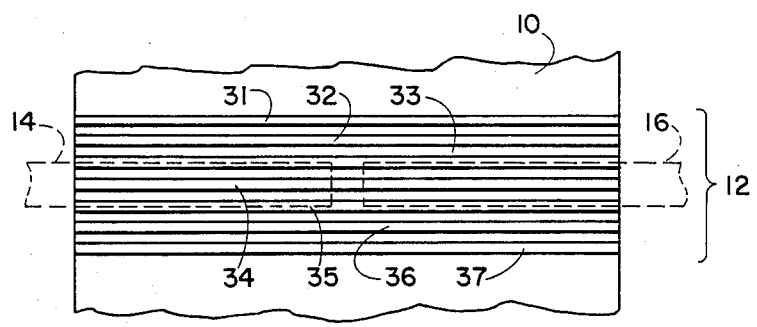
FIG. 2 is an underview of a flexible sheet insulating medium in FIG. 1, to an enlarged scale, indicating the individual conductors of a conductive layer in greater detail.

Referring to the drawings, and particularly to FIGS. 1 and 2, an interconnect according to the present invention employs a thin, flexible sheet of insulating plastic film material 10 which carries on its underside a conductive layer 12 of predetermined configuration adapted to make connection between conductors 14 and 16 of respective integrated or hybrid circuit devices 18 and 19. The sheet of film material 10 is suitably formed of about seventy-five micron thick polyimide or mylar insulating sheet onto which the thin conductive layer 12 is adhered. The materials for sheet 10 are chosen for their environmental stability but other similar materials may be substituted for the examples given.

In one particular example, sheet 10 comprised a product known as copper-clad Kapton including a thin layer of copper adhesively attached to the polyimide. Part of the copper was removed by a conventional photoetching process, except in the area of the desired configuration for conductor 12, and the remaining conductor was plated with gold in a conventional manner. The conductive layer is less than twenty-five microns in thickness. The sheet 10 including the conductor 12 is very flexible and conformable to differing elevations or possible angular misalignment of the conductors 14 and 16 such that a good connection is consistently produced.

The flexible sheet medium 10 is backed by a body 20 of elastomeric material which may comprise a foam, but which preferably comprises a so-called solid elastomer such as a silicon elastomer having a durometer hardness of approximately forty. In any event, the body 20 suitably has a dielectric constant close to that of air and consequently has substantially no electrical effect on the connection. The sheet material 10 can be secured to the underside of body 20, which is normally substantially flat, with an acrylic based adhesive or a pressure sensitive adhesive. However, the manner of attachment is not particularly critical.

The medium 10 is placed in contact with circuit devices 18 and 19, with conductive layer 12 in juxtaposition with conductors 14 and 16, while the body of elastomeric material 20 is compressed toward circuit devices 18 and 19 by means of a bar 22 secured to underlying circuit housing 24 by machine screws 26 and 28. The elastomeric material 20 distributes an even load on the layers 12, 14 and 16 and takes up surface variations as the conductive layer 12 conforms to the conductors 14 and 16. The bar 22 is formed from an insulating plastic material, for example a suitable resin, and the mounting screws 26 and 28 are received through bores in the end of bar 22 sufficiently spaced from the underlying connections and circuitry to prevent undesirable capacitive effects.

The conductive layer 12 on the underside of medium 10 is illustrated in greater detail in FIG. 2 wherein it can be seen the conductive layer suitably comprises a plurality of separated, but closely spaced, parallel conductors or conductive lines 31 through 37, each of which extends axially of the conductors 12, 14 and 16, and at least some of which complete a circuit between the conductors 14 and 16. The group of parallel conductors may be wider than conductors 14, 16 to assure some connection despite possible misalignment. However, the individual conductor width, and the spacing therebetween, is small compared with the width of device conductors 14 and 16. In the particular case illustrated in FIG. 2, conductors 33, 34, and 35 are in registration with and make contact with conductors 14 and 16 on the respective circuit devices, while conductors 31, 32, 36 and 37 are left unconnected, the lines 31 through 37 being insulated from one another. This configuration provides the desired electrical coupling between the circuit devices without requiring exact alignment between various parts, and without forming a discontinuity as would be present if the conductive layer 12 were merely made wider without at the same time being segmented into parallel conductors. Since only conductors 33, 34 and 35 in FIG. 2 make connection with both conductors 14 and 16, the effective width of conductive layer 12 is the outside-to-outside distance across conductors 33–35, and not the outside-to-outside distance across all of the conductors 31–37, and therefore nearly matches the width of conductors 14, 16. Inasmuch as conductors 14, 16 frequently form a part of a strip line together with conductive layers (not shown) on the underside of elements 18, 19, and in any event may couple high frequency signals, a width discontinuity is avoided at the connection in order to avoid an unacceptable electrical mismatch and RF reflection along the conductors. Thus minor alignment problems can be alleviated both from a mechanical viewpoint, with the conductor on medium 10 conforming to the underlying conductor, and from the electrical viewpoint, with the conductive layer 12 providing an electrical connection without substantial RF discontinuity. The connection is effective up to frequencies as high as ten gigahertz. Of course, with very accurate registration of conductive layer 12 with conductors 14 and 16, conductive layer 12 can be the same width as conductors 14, 16 rather than being wider and segmented. With a single, accurately aligned layer 12, operation is possible to frequencies higher than ten gigahertz.

Figure 3:
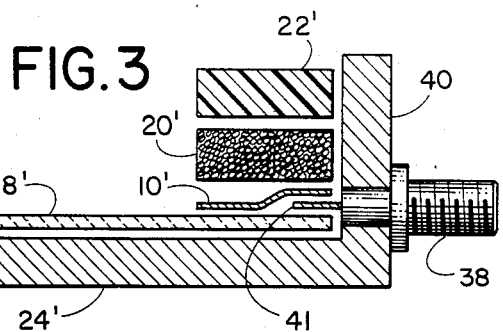
FIG. 3 is a longitudinal, exploded cross section of a microwave interconnect· device according to the present invention in a second application.
Figure 4:
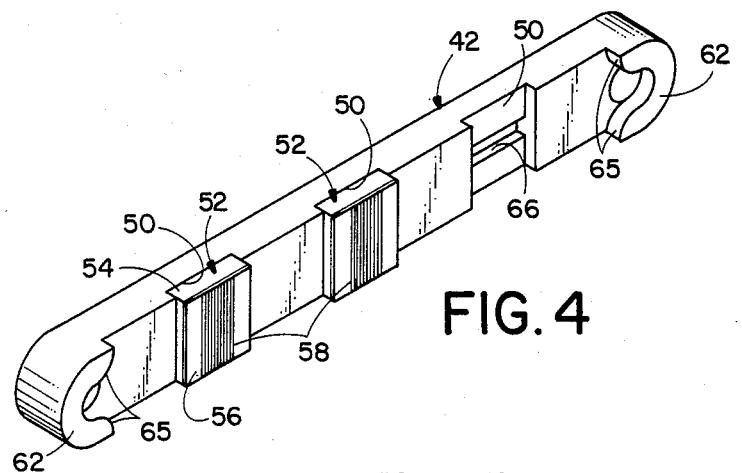
FIG. 4 is a perspective, underside view of a microwave interconnect device according to another embodiment of the present invention.

Referring to FIG. 3, a slightly different utilization of the interconnect according to the present invention is illustrated, with corresponding elements being referenced by primed reference numerals. In this instance, connection is made between a conductor on hybrid circuit substrate 18' supported within housing 24', and a coaxial connector 38 disposed in vertical wall 40 of the housing. As in the case of the illustration of FIG. 1, the device in FIG. 3 is illustrated in exploded-view fashion, and it is understood bar 22' is urged downwardly against elastomer body 20' employing screws or other fastening means (not shown) so that the elastomer body 20' compresses medium 10' toward circuit substrate 18'. A flexible conductor on the underside of medium 10' (corresponding to conductor 12 in FIGS. 1 and 2) is located in substantial juxtaposition with a conductor on the upper side of substrate 18', and also in juxtaposition with center conductor tab 41 of connector 38, which tab is positioned between medium 10' and substrate 18'. Although the center conductor tab 41 is ideally positioned immediately above and in contact with the conductor on substrate 18', the actual electrical connection relied upon is via the flexible conductor on medium 10' as it makes connections with center conductor tab 42 and the conductor on the upper side of substrate 18'. The flexible medium 10', and the conductor carried thereby, conform to the mechanical configuration and step-misalignment of the parts in order to provide a reliable connection.

A further embodiment of the present invention is illustrated in FIGS. 4–7 wherein a bar 42 is adapted to be secured to housing 44 by means of machine screws 46 and 48. The underside of the bar is provided with three equally spaced slots 50 extending crossways of the bar for receiving inserts 52, each insert comprising a body of elastomeric material 54 having a flexible insulating medium 56 secured to the outwardly facing side thereof. The outer face of the insulating medium is provided with a conductive layer 58 extending in a direction crossways of bar 42 and may comprise a plurality of closely spaced, parallel conductors. Each insert 52 is suitably constructed in substantially the same manner and may employ the same materials as the elastomeric body, insulating medium and conductive layer combination as hereinbefore described.

The bar 42 carrying inserts 52 is adapted to complete a plurality of connections between circuitry on substrate 60 and a second device or connector (not shown) located adjacent the end of substrate 60 and laterally adjacent bar 42 in the manner described in connection with the previous embodiments. Thus, bar 42 is located in bridging relation to a device carried by substrate 60 and a second device with which connection is made by means of inserts 52.

The bar 42 in this embodiment is provided proximate each end thereof with a downwardly extending, indexing leg 62 which protrudes farther toward the top surface of housing 44 than does the main undersurface 64 of bar 42. The legs 62 are intersected by bores for receiving machine screws 46, 48, and are provided with slightly rounded, inwardly facing nibs or edges 65 adapted to closely receive the substrate 60 therebetween so as to maintain a perpendicular relation between bar 42 and the substrate while laterally aligning the pads 52 and their conductors 58 in correct position with respect to the conductors they connect.

Figures 5, 6:
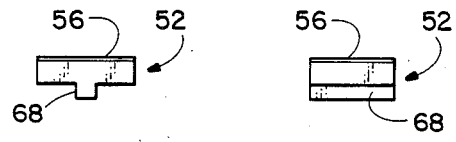
FIG. 5 is a side view of an insert provided with a conductive layer as utilized in the FIG. 4 embodiment.
FIG. 6 is an end view of the FIG. 5 insert.

The inserts 52, located within the slots 50, are thus accurately positioned along the bar 42 and the conductors 58 are maintained in perpendicular relation thereto. The bottom of each slot 50 is also suitably provided with a longitudinally extending cross slot 66 which receives a similarly shaped protrusion 68 located on the back side of the corresponding insert. The inserts and the slots in which they are received are substantially T-shaped as illustrated in FIGS. 5 and 6, wherein the stem of the T corresponds to the longitudinal cross slot. This configuration prevents movement of the inserts 52 in a direction longitudinal of the conductive layers 58 while allowing the slots 50 to be open at each end for enhancing the flexibility of the inserts. The inserts are thicker than the depth of slots 50 so as to extend below bar surface 64, when the bar is secured in place, for insuring a connection between conductors 58 and the circuitry therebelow.

Figure 7:
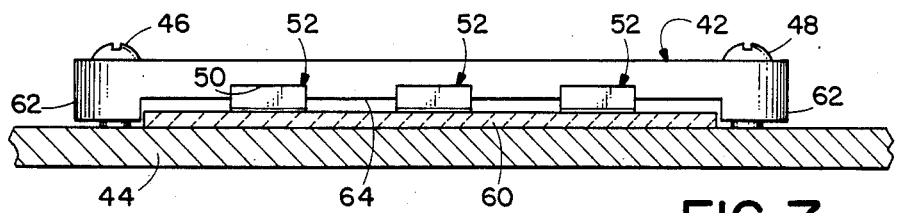
FIG. 7 is a side, in-place, view of a microwave interconnect device according to the FIG. 4 embodiment.

In FIG. 7, the bar 42 is illustrated as having the lower extremities of legs 62 spaced slightly from the top surface of housing 44, but it will be realized the bar may be positioned more closely to the housing if desired. It is preferred that the thickness of substrate 60 plus the thickness of the portion of each insert protruding below surface 64 (in relaxed condition) be greater than the length of each leg 62 below surface 64 to ensure compression of the inserts 52 against the circuit devices. It is further preferred that the length of legs 62 be slightly greater than the thickness of substrate 60 to avoid damage to the substrate if bar 42 is drawn up tightly against the housing.

Figure 8:
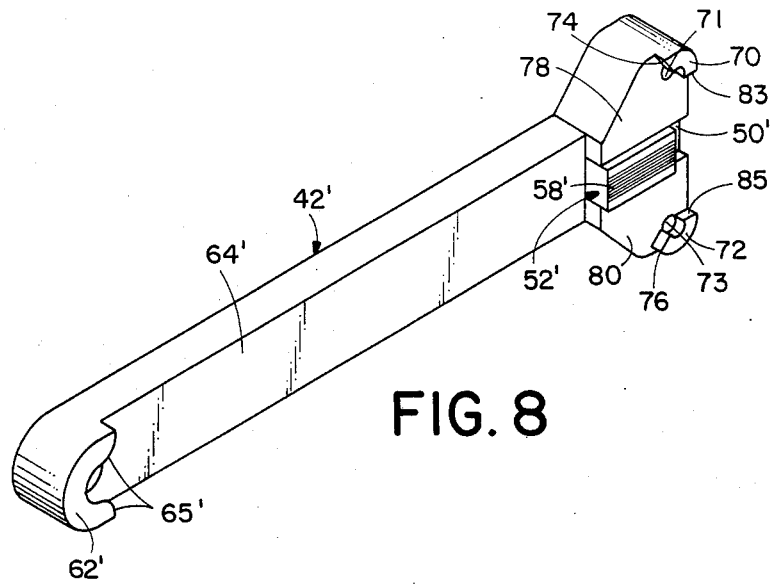
FIG. 8 is a perspective, underside view of a microwave interconnect device according to yet another embodiment of the present invention.
Figure 9:
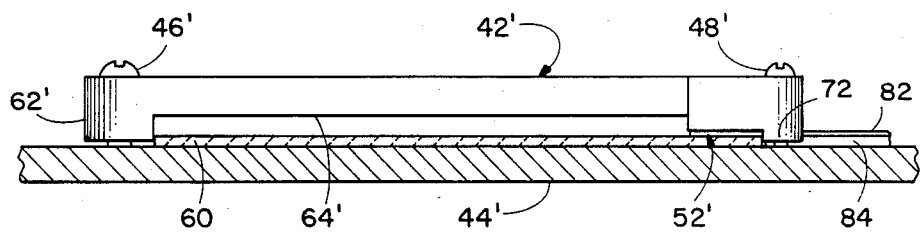
FIG. 9 is a side, in-place, view of a microwave interconnect device according to the embodiment of FIG. 8.

Referring to FIGS. 8 and 9, illustrating a further embodiment of the present invention wherein corresponding elements are referenced by primed reference numerals, a bar 42' is adapted to bridge a substrate 60' carrying a first circuit device positioned for connection to a conductive element 82 carried by a second device or substrate 84 located at one end of bar 42'. The interconnect of FIGS. 8 and 9 is adapted to provide connection between a conductor on substrate 60' extending crossways of the substrate, i.e., parallel to bar 42', and conductive element 82 oriented in a similar direction, that is in perpendicular relation to substrate 60' or in parallel relation to bar 42'. As in the previous embodiment, a downwardly extending indexing leg 62' engages one side of substrate 60' to provide proper alignment of bar 64' relative to the substrate. However, in the present instance the opposite end of the bar 64' is broadened to provide bifurcated, downwardly extending leg portions 70 and 72 having inwardly directed nibs or edges 74 and 76, respectively, for engaging the remaining side of substrate 60'. The leg portions 70 and 72 are intersected by bores 71 and 73 receiving machine screws 48' and the leg portions recede away from edges 74 and 76 in a curvilinear fashion around bores 71 and 73, terminating in facing edges or nibs 83, 85. Nibs 83, 85 may be utilized to align a substrate 84 therebetween, or the machine screws 48' may pass through the substrate (or other device) 84 whereby alignment thereof relative to bar 42' and substrate 60' is facilitated.

The lower surface 64' of bar 42' is farther away from the substrate it bridges than in the case of surface 64 in the previous embodiment, but the bar 42' is "stepped down" at portions 78 and 80, where the bar becomes broader, so as to provide the slot 50' aligned with the longitudinal direction of the bar and receiving an insert 52' carrying conductive layer 58' oriented in a direction longitudinal of the bar. The insert 52' is substantially identical in construction to an insert 52 as depicted in FIGS. 5 and 6, and similarly includes a T-stem shaped protrusion 68 which is received in a deeper slot (not shown) extending crossways of slot 50'. In the illustrated embodiment, the lower level 64' of bar 42' and the bottom level of slot 50' (except for the T-stem shaped cross slot) are at the same level such that bar portions 78 and 80 define the slot 50' therebetween.

It is seen the interconnect illustrated in FIGS. 8 and 9 facilitates a side edge connection to the underlying circuit device, as compared with the previous embodiments which facilitate end connections thereto. It will be realized the terms "side" and "end" are meaningful primarily in respect to a circuit device of somewhat elongated shape having interconnect means bridging the width or shorter dimension thereof. However, it is apparent that interconnects according to the present invention are useful with circuit devices of different shapes.

The bars 42 and 42' are suitably molded from any non-flowing plastic with high rigidity. In constructed embodiments, a glass filled, polyphenylene sulfide material was utilized and is prefer- red.

While several embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An interconnector adapted to provide electrical connection between electrical devices, at least one of which has an electrical circuit mounted on a substrate, comprising:

a flexible insulating medium provided thereon with a conductive run for each electrical connection between the electrical devices, the conductive run being separated into a plurality of substantially parallel conductors for each electrical connection and having a width greater than a terminal portion of the electrical devices between which it is designed to make connection such that fewer than all said substantially parallel conductors interconnect the electronic devices for each connection while maintaining an electrical width essentially equal to the width of the terminal, a body of elastomeric material secured to the flexible insulating medium on the side opposite the conductive run, and a bar for constraining said body of elastomeric material in compressive relationship against said flexible insulating medium for urging said conductive run against said electrical devices for making electrical connection therebetween, the flexible insulating medium conforming to the conductive surfaces thereof, the bar having downwardly extending indexing legs adapted to closely receive the electrical circuit devices therebetween for aligning the conductive run relative to said electrical devices and having a slot for alignably receiving said body of elatomeric material such that the bar bridges across said one electrical device for providing a connection between said one electrical device and another of said electrical devices disposed proximate one end of said bar, the slot being located in the end of the bar proximate the another of said electrical devices and the conductive run extending in a direction longitudinal of the bar proximate the one end thereof.

2. The interconnect according to claim 1 wherein one of said electrical devices comprises a device selected from the group consisting of an integrated circuit device and a hybrid circuit device.

3. The interconnect according to claim 1 wherein one of said electrical devices comprises an electrical connector.

4. The interconnect according to claim 1 wherein said body of elastomeric material has a dielectric constant near that of air.

5. The interconnect according to claim 1 including a housing for said electrical device having a substrate, and means for securing said bar to said housing.

6. The interconnect according to claim 1 wherein said slot is T-shaped to receive a similarly shaped body of elastomeric material, the stem of the T extending in a direction perpendicular to the direction of said conductive runs.

7. The interconnect according to claim 1 wherein said bar is provided therealong with additional spaced slots for alignably receiving other bodies of elastomeric material similarly provided with flexible insulating media carrying conductive runs for completing additional connections.

8. The interconnect according to claim 1 wherein said bar is provided with said indexing legs proximate opposite ends thereof and bridges across said one electrical device for providing a connection between said electrical devices located laterally adjacent said bar, and wherein said slot extends crossways of said bar and receives said body of elastomeric material carrying said flexible insulating medium which is provided with said conductive run extending in a direction perpendicular to said bar.

9. The interconnect according to claim 1 wherein a said indexing leg proximate said one end of said bar is bifurcated, with said slot receiving said body of elastomeric material located in a position between bifurcations thereof.

* * * * *